(12) United States Patent
Robert

(10) Patent No.: US 7,592,739 B2
(45) Date of Patent: Sep. 22, 2009

(54) TUNABLE BULK ACOUSTIC WAVE MEMS MICRO-RESONATOR

(75) Inventor: Philippe Robert, Grenoble (FR)

(73) Assignee: Commissariat a l'Energie Atomique, Paris (FR)

(*) Notice: Subject to any disclaimer, the term of this patent is extended or adjusted under 35 U.S.C. 154(b) by 157 days.

(21) Appl. No.: 10/502,802

(22) PCT Filed: Feb. 11, 2003

(86) PCT No.: PCT/FR03/00427
§ 371 (c)(1),
(2), (4) Date: Feb. 28, 2005

(87) PCT Pub. No.: WO03/069776
PCT Pub. Date: Aug. 21, 2003

(65) Prior Publication Data
US 2005/0162040 A1 Jul. 28, 2005

(30) Foreign Application Priority Data
Feb. 13, 2002 (FR) .................................. 02 01759

(51) Int. Cl.
*H01L 41/08* (2006.01)
(52) U.S. Cl. .................. 310/330; 310/320; 310/331
(58) Field of Classification Search .......... 310/324, 310/363–366, 343, 330–332, 320
See application file for complete search history.

(56) References Cited

U.S. PATENT DOCUMENTS

| 5,446,306 | A | 8/1995 | Stokes et al. | |
| 6,359,374 | B1* | 3/2002 | Dausch et al. | 310/330 |
| 7,323,805 | B2* | 1/2008 | Sano et al. | 310/358 |
| 7,372,191 | B2* | 5/2008 | Ohmori et al. | 310/330 |
| 2001/0022546 | A1 | 9/2001 | Frey et al. | |
| 2003/0057806 | A1* | 3/2003 | Peczalski | 310/324 |
| 2004/0251781 | A1* | 12/2004 | Bouche et al. | 310/324 |
| 2005/0028336 | A1* | 2/2005 | Robert et al. | 29/25.35 |

FOREIGN PATENT DOCUMENTS

| EP | 0963000 | 12/1999 |
| JP | 60-187116 | 9/1985 |
| JP | 63-187713 | 8/1988 |
| JP | 7-203593 | 8/1995 |
| JP | 07-226648 | 8/1995 |
| JP | 2000-030595 | 1/2000 |
| JP | 2001-156350 | 6/2001 |
| JP | 2002-16477 | 1/2002 |

* cited by examiner

*Primary Examiner*—Jaydi SanMartin
(74) *Attorney, Agent, or Firm*—Oblon, Spivak, McClelland, Maier & Neustadt, L.L.P.

(57) ABSTRACT

A suspended film bulk acoustic micro-resonator that includes a beam made of a piezoelectric material fixed to a support and sandwiched between excitation electrodes. The resonator also includes a mechanism modifying limiting conditions of the resonator composed of the excited beam to modify the micro-resonator resonant frequency.

23 Claims, 9 Drawing Sheets

TUNABLE BULK ACOUSTIC WAVE MEMS MICRO-RESONATOR

TECHNICAL DOMAIN

This invention relates to a tuneable MEMS (Micro-Electro-Mechanical System) film bulk acoustic micro-resonator.

STATE OF PRIOR ART

Several filtering levels are necessary, for example in a transmission-reception system for mobile communications: the antenna output as a band or rejection filter, etc. At the moment, two main solutions are used to make RF filters:
- SAW (Surface Acoustic Wave) components that give excellent results but cannot be added into integrated circuits directly;
- RLC circuits that can be integrated but for which the characteristics are mediocre considering the performances of each component, particularly the inductance (it is difficult for the quality factor of an integrated inductance to exceed 30).

A third line of research appears, based on the use of mechanical Film Bulk Acoustic Resonators (FBARs). These resonators may be integrated and provide high quality factors (more than 1000). Consequently, these are useful devices since they normally offer good performances (high quality factor) and a low production cost (devices that can be integrated).

Therefore acoustic wave resonators are classified in two categories: Surface Acoustic Wave (SAW) resonators and Film Bulk Acoustic Resonators (FBAR).

For SAW resonators, a surface wave is generated by exciting a piezoelectric material (quartz, $LiNbO_3$, $LiTaO_3$) through a comb electrodes network. This wave is detected by a second set of interdigitised electrodes. The width, spacing and number of excitation and detection combs control the resonant frequency of the oscillator or the filter pass band. SAW filters are used in frequency ranges varying from 100 MHz to about 2.5 GHz. The surface area of these devices, which is a few $mm^2$, and the piezoelectric materials used (quartz, $LiNbO_3$, $LiTaO_3$, etc.) make the principle unsuitable for production on an integrated circuit. Although this type of component is high performance and widely tested, it is reserved more particularly for a hybridisation technology.

In the case of FBAR resonators, a bulk acoustic wave is generated by excitation of a thin piezoelectric layer (made of AlN, PZT or ZnO) between two electrodes. For these micro-mechanical resonators, filters are usually made by coupling several of these resonators together. Resonant frequencies of the resonators, which are usually close, fix the central frequency of the filter. The pass band of the filter depends on the coupling characteristics (position, dielectric strength), while the number of resonators gives the order of the filter. This type of resonator can be used to make filters within the 300 MHz-12.5 GHz range.

FBAR resonators can be classified in two groups, called FBAR-MEMS and SMR in the specialised literature. In the case of FBAR-MEMS, the piezoelectric material resonator is separated from the substrate to avoid any dissipation of acoustic waves. This spacing is obtained either by etching the back face of the substrate, or by suspending the resonator by the use of a sacrificial layer. In the case of SMRs (Solidly Mounted Resonator), an acoustic Bragg grating is used underneath the piezoelectric material resonator. This acoustic Bragg grating is composed of a multi-layer of materials, each layer of the multi-layer being $\lambda/4$ thick (where $\lambda$ is the wavelength corresponding to the frequency of the resonator) and having a Young's modulus very different from one layer to the next. This multi-layer will reflect the acoustic wave.

For these types of film bulk acoustic resonators, the resonant frequency is inversely proportional to the thickness of the piezoelectric layer. For example, in the case of an AlN resonator, a frequency of 1 GHz is obtained for a thickness of about 1 μm.

In RF applications, a search is conventionally made for resonant frequencies of the order of one gigahertz, corresponding to piezoelectric material thicknesses approximately equal to one micrometer (usually 1 to several micrometers) with a control over this frequency within a few MHz or a few tens of MHz. This frequency variation corresponds to control over the thickness of the piezoelectric material layer of the resonator within less than 10 nm (corresponding to a dispersion of less than 1%). This thickness check is hardly possible in an industrial context.

Moreover, none of these components according to prior art is tuneable.

SUMMARY OF THE INVENTION

This invention overcomes this weakness in prior art by using an FBAR-MEMS type resonator (in other words a suspended film bulk acoustic resonator) with a system capable of applying a variable mechanical stress on the resonator.

Its purpose is a suspended film bulk acoustic micro-resonator comprising a beam made of a piezoelectric material fixed to a support and with a thickness selected to operate at a given resonant frequency, the beam being sandwiched in the direction of its thickness between excitation electrodes, characterised in that it also comprises means of modifying limiting conditions of the resonator composed of the excited beam in order to modify the said resonant frequency.

According to a first variant, the means of modifying the limiting conditions of the resonator comprise means of applying a mechanical stress on the beam.

According to a first embodiment, the means of applying a mechanical stress on the beam enable the application of an electrostatic force on the beam, resulting in bending of the beam. The beam may be fixed to the support by its two ends or by only one of its ends. If the beam is separated from the support by the presence of a cavity facing the beam, the means of applying an electrostatic force may include at least one electrode located on the said beam and at least one electrode facing this electrode and in the cavity. The electrode used to apply an electrostatic force located on the beam may be one of the excitation electrodes.

According to a second embodiment, the means of applying a mechanical stress on the beam are means of producing a bimetallic strip effect. The means of producing a bimetallic strip effect may include at least one bimetallic strip effect resulting from a metallic layer formed on one face of the beam and a heating element. They may then be placed on the same face of the beam. The means of producing a bimetallic strip effect can also form at least one double bimetallic strip, a first bimetallic strip effect device being located on one face of the beam and a second bimetallic strip effect device being located on the other face of the beam, these two bimetallic strip effect devices being located facing each other. The heating element may be an electrical resistance supported by the metallic layer and separated from the metallic layer by a layer of electrical insulation. It may also be composed of the metallic layer of the bimetallic strip effect device.

According to a third embodiment, the means of applying a mechanical stress on the beam are piezoelectric means. These piezoelectric means may include electrodes on at least one face of the beam, for applying an electrical field to the beam, which results in a compression/expansion stress or a shear stress in the plane of the beam. One of the electrodes of the piezoelectric means may be an excitation electrode.

According to a second variant, the means of modifying the limiting conditions of the resonator include means of applying a mechanical load on the beam. Advantageously, the means of applying a mechanical load on the beam include at least one loading beam fixed to the support and facing the beam made of a piezoelectric material so as to apply the said mechanical load under the action of an electrostatic force applied to the loading beam by means of applying an electrostatic force. These means of applying an electrostatic force may include a first electrode arranged on the loading beam and a second electrode consisting of one of the excitation electrodes.

According to a third variant, the means of modifying the limiting conditions of the resonator include means of modifying the temperature of the beam made of a piezoelectric material. Advantageously, the means used to modify the temperature of the beam made of piezoelectric material include at least one electrical resistance. The electrical resistance may be arranged on one of the excitation electrodes and may be separated from it by a layer of electrical insulation.

The beam made of a piezoelectric material provided with its excitation electrodes may be fixed to the support through a layer of a dielectric material.

BRIEF DESCRIPTION OF THE FIGURES

The invention and its advantages and special features will be better understood after reading the following description given as a non-limitative example, with the appended figures wherein.

DETAILED DESCRIPTION OF EMBODIMENTS OF THE INVENTION

The following description applies to three variant embodiments of the invention.

According to the first variant, the limiting conditions of the resonator are modified by applying a mechanical stress to the beam forming the resonator. The mechanical stress may be the result of an electrostatic force causing bending of the beam, with or without modification to its end embedment. The mechanical stress may also be the result of a thermal bimetallic strip type effect causing pure compression effect (in the case of a double bimetallic strip) or a combined bending moment and compression (for a single bimetallic strip). The mechanical stress may also be the result of a piezoelectric stress introduced by excitation of the resonator itself (for example, deformation of the resonator in the direction of its length or its thickness).

According to the second variant, the resonator limiting conditions are modified by applying a variable load to the resonator. The variable load may originate from gluing located on an additional beam or a loading beam on the resonator through electrostatic forces.

According to the third variant, the limiting conditions of the resonator are modified by varying its temperature. The resonator temperature may be modified and controlled by means of a heating resistance located on the beam forming the resonator.

In the same was as for any mechanical resonator, this variation in the limiting conditions (stresses, load, temperature) is expressed as a variation in the resonant frequency of the system (modification to limiting conditions).

The possibility of controlling the resonant frequency of oscillators according to the invention means firstly that control over the thickness of the layer of piezoelectric material can be relaxed, and secondly the resonance of each of the oscillators can be controlled dynamically in order to make a tuneable filter.

Figure 1:
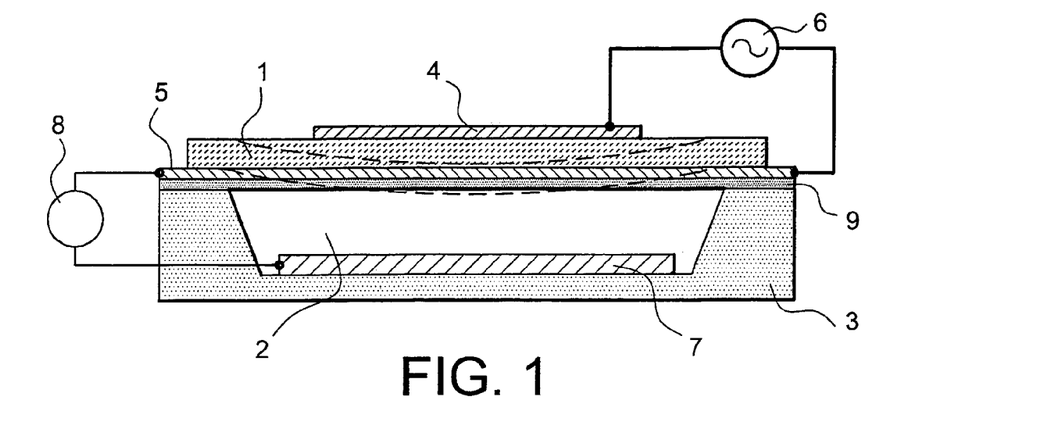
FIG. 1 is a sectional view of a micro-resonator according to the first variant of the invention.

FIG. 1 shows a sectional view of a micro-resonator according to the first variant of the invention, in which the stress applied to the beam is due to an electrostatic force.

A layer of piezoelectric material 1 is suspended above a cavity 2 made in a support 3. It is of the built-in beam type at both of its ends. For example, the depth of the cavity 2 may be between a few tenths and a few tens of μm, for example 1 to 2 μm. The piezoelectric material beam 1 is sandwiched between a first set of electrodes; an upper electrode 4 and a lower electrode 5. This first set of electrodes is intended to apply one or more resonant modes to the beam. This is achieved by connecting electrodes 4 and 5 to an alternating voltage generator 6 at the resonant frequency of the chosen mode.

A second set of electrodes is used to apply an electrostatic force to the beam. This second set of electrodes may be composed of an electrode 7 placed at the bottom of the cavity 2 and by the lower electrode 5 arranged facing the electrode 7. A polarisation voltage output by a DC current generator 8 is applied between the electrodes 5 and 7 to induce bending of the beam. This bending generates a stress on the resonator, which is translated by a change to its resonant frequency. Since the stress is a function of the polarisation voltage, the resonant frequency is also related to the polarisation voltage.

For technological production reasons, a layer 9 forming the support beam may be inserted between the support 3 and the resonator. The layer 9 may be made of silicon nitride or oxide.

Deformation of the beam 1 under the effect of an electrostatic force has been shown as dashed lines.

Figure 2:
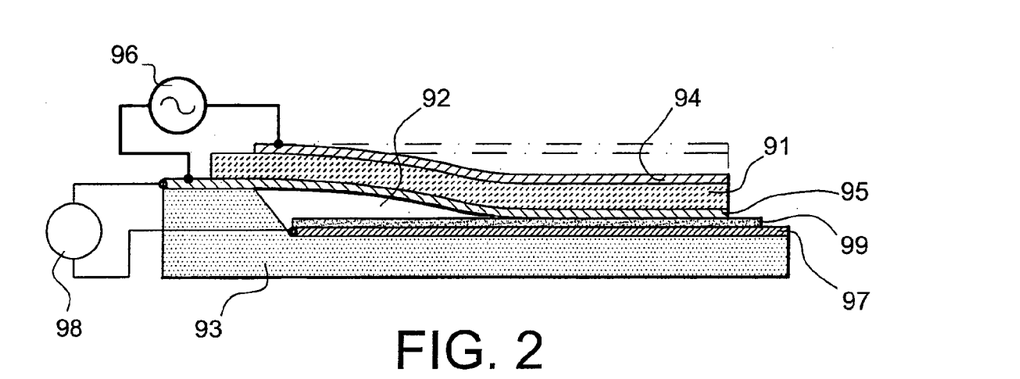
FIG. 2 is a sectional view of another micro-resonator according to the first variant of the invention.

FIG. 2 shows a sectional view of another micro-resonator according to the first variant of the invention, also in the case in which the stress applied to the beam originates from an electrostatic force. Unlike the beam in FIG. 1, the beam forming the resonator is a cantilever beam.

A beam made of a piezoelectric material 91 is suspended as a cantilever above a cavity or a recess 92 in a support 93. The beam 91 is sandwiched between an upper electrode 94 and a lower electrode 95 that will apply one or more resonant modes to the beam. To achieve this, the electrodes 94 and 95 are connected to an alternating voltage generator 96 at the resonant frequency of the chosen mode.

An electrode 97 is placed at the bottom of the cavity 92 and is coated by a layer of dielectric material 99. A polarisation voltage output by a DC voltage generator 98 is applied between the electrodes 95 and 97 to induce bending of the beam.

In FIG. 2, the beam 91 is shown in dashed lines for no polarisation voltage and in solid lines for an applied polarisation voltage. The continuous or discontinuous layer of dielectric material 99 (for example in the form of small dielectric pads) prevents any short-circuits between the electrodes 95 and 97. Depending on the applied polarisation voltage, the beam 91 is attracted more or less towards the bottom of the cavity 92.

Figure 3:
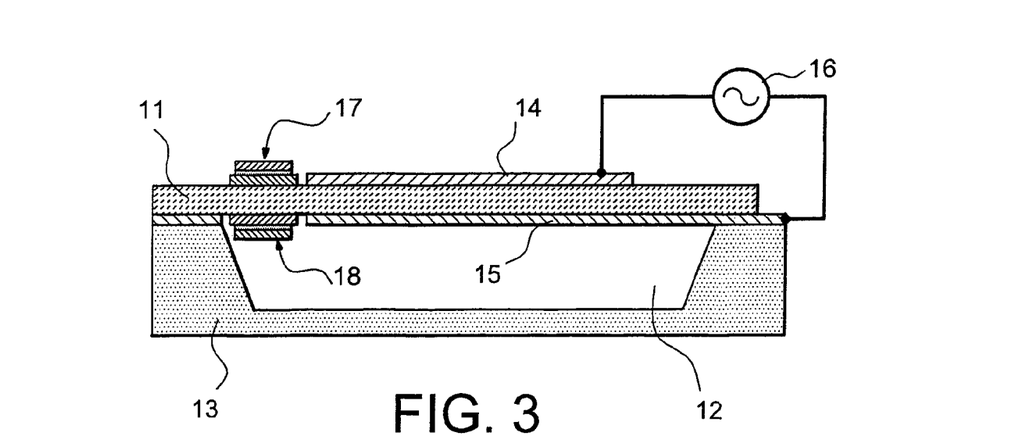
FIG. 3 is a sectional view of yet another micro-resonator according to the first variant of the invention.

FIG. 3 shows a sectional view through another micro-resonator according to the first variant of the invention, in which the stress applied on the beam is due to a thermal bimetallic strip effect.

As in FIG. 1, a beam made of a piezoelectric material 11 is suspended above a cavity 12 formed in a support 13. The depth of the cavity 12 may be between a few tenths and a few tens of μm, for example 1 to 2 μm. The beam made of a piezoelectric material 11 is sandwiched between an upper electrode 14 and a lower electrode 15 that will apply one or more resonant modes to the beam 11. To achieve this, the electrodes 14 and 15 are connected to an alternating voltage generator 16 at the resonant frequency of the chosen mode.

A thermal bimetallic strip may be arranged on one or several parts of the beam, on or underneath the beam. In the case shown in FIG. 3, the beam supports two thermal bimetallic strips 17 and 18 facing each face of the beam made of a piezoelectric material 11. Each bimetallic strip 17 and 18 is composed of a layer with a high coefficient of thermal expansion (generally a metallic layer) arranged on the beam made of a piezoelectric material, which has a low coefficient of thermal expansion, and a heating element composed of an electrical resistance. The heating element may form part of the layer with a high coefficient of thermal expansion or it may be an add-on layer, isolated from the layer with a high coefficient of thermal expansion by a thin dielectric layer.

By passing a current in the electrical resistance of a heating element, the temperature of the bimetallic strip (composed of the layer with a high coefficient of thermal expansion and the beam) increases. Under the effect of this temperature increase, the differential expansion of the two materials of the bimetallic strip generates a compression force and a bending moment on the beam. If the beam supports two bimetallic strips arranged as shown in FIG. 2, the beam is only subjected to a compression force.

Figure 4:
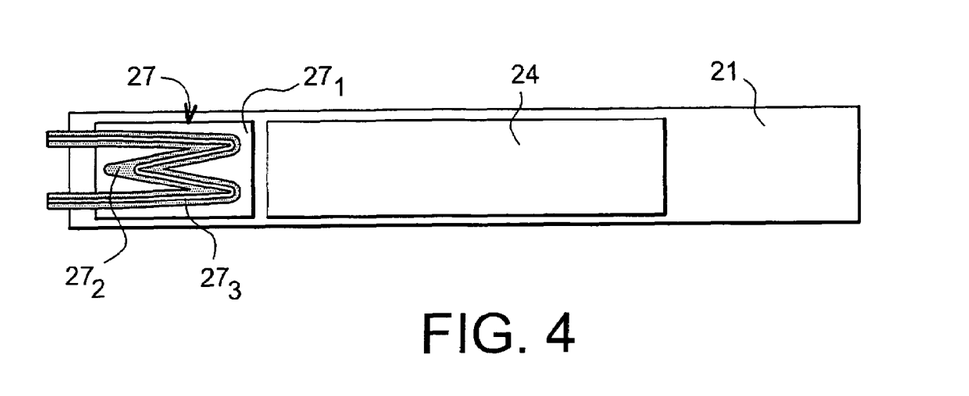
FIGS. 4 to 6 are top views illustrating several possible configurations for the micro-resonator according to FIG. 2.
Figure 5:
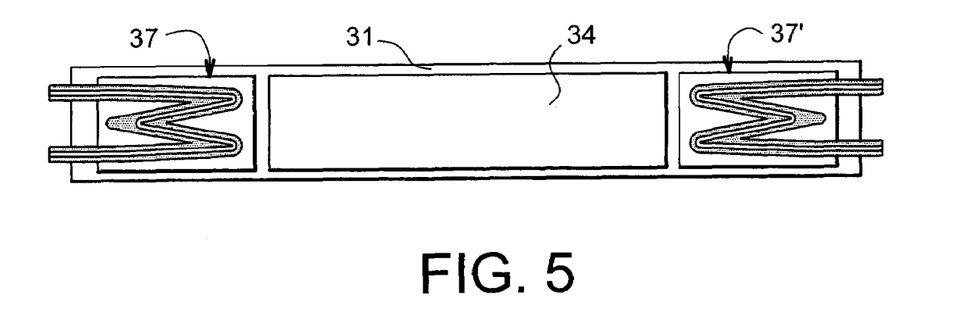
Figure 6:
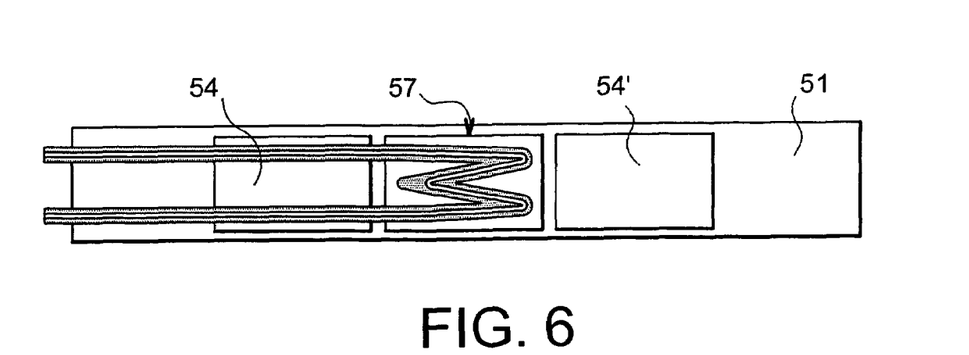

FIGS. 4 to 6 show top views illustrating several possible arrangements for the bimetallic strips.

FIG. 4 shows a layer of piezoelectric material 21 forming the beam and supporting an upper electrode 24 provided to apply an alternating voltage to the beam. The bimetallic strip 27, present on one end of the top face of the beam, comprises a metallic layer $27_1$ deposited on the beam, an electrical insulation layer $27_2$ and an electrical resistance $27_3$.

FIG. 5 shows a layer of piezoelectric material 31 forming the beam and supporting an upper excitation electrode 34 of the resonator. The beam supports a bimetallic strip 37, 37' of the type described in FIG. 4, at each of its ends and at its top face.

FIG. 6 shows a layer of piezoelectric material 51 forming a beam and supporting an upper electrode in two parts 54, 54' forming the upper excitation electrode of the resonator. The central part of the beam is occupied by a bimetallic strip 57 of the type described in FIG. 4.

Figure 7:
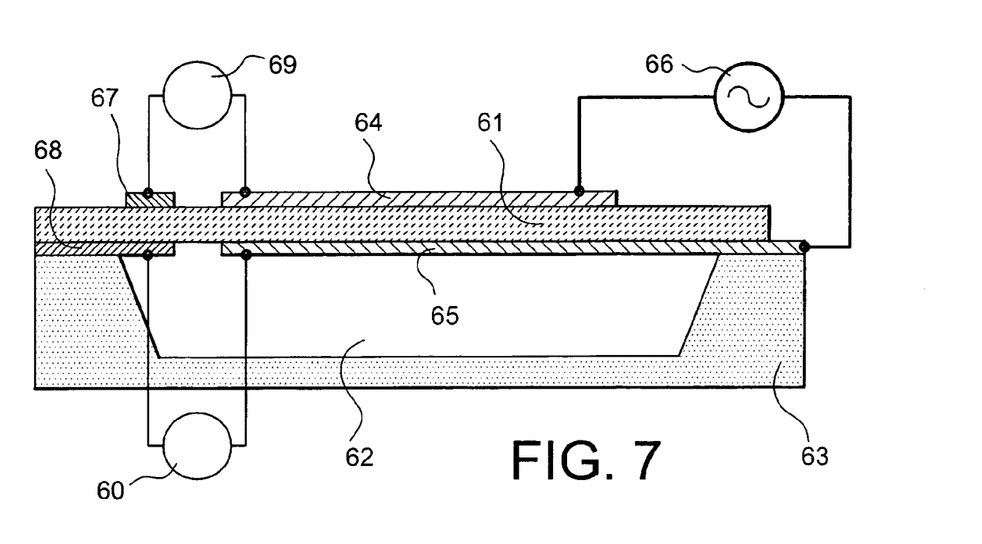
FIG. 7 is a sectional view of yet another micro-resonator according to the first variant of the invention.

FIG. 7 shows a sectional view of a micro-resonator according to the first variant of the invention, in the case in which the stress applied to the beam originates from a deformation of the resonator by the piezoelectric effect.

As for FIGS. 1 and 3, a beam made of a piezoelectric material 61 is suspended above a cavity 62 made in a support 63. The depth of the cavity 62 may be between a few tenths and a few tens of μm, for example 1 to 2 μm. The beam made of a piezoelectric material 61 is sandwiched between an upper electrode 64 and a lower electrode 65 that will be used to excite the beam. To achieve this, the electrodes 64 and 65 are connected to an alternating voltage generator 66 at the resonant frequency of the chosen mode.

Additional electrodes on the top face and/or the bottom face of one or several parts of the beam are arranged to generate a continuous electric field in the beam made of a piezoelectric material 61. The arrangement of these electrodes depends on the orientation of the piezoelectric crystal and the required deformation direction. In the case shown in FIG. 7, an additional electrode 67 is arranged on the top face of the beam and an additional electrode 68 is arranged on the bottom face of the beam. The electrodes 64 and 67 are connected to a first dc voltage generator 69. The electrodes 65 and 68 are connected to a second continuous voltage generator 60. The local deformations generated by the dc voltages are applied firstly to electrodes 64 and 67 and secondly to electrodes 65 and 68, and have the effect of making the resonant frequency of the resonator vary.

Figure 8:
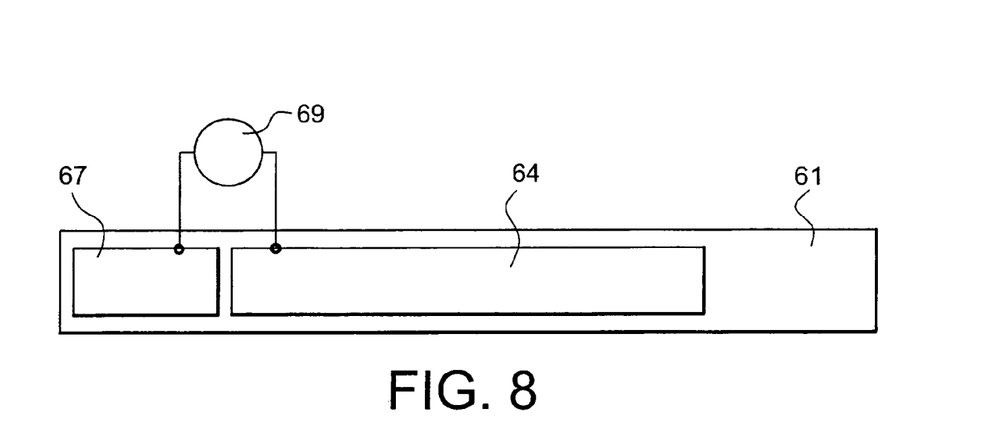
FIGS. 8 to 10 are top views illustrating several possible configurations for the micro-resonator in FIG. 7, FIGS. 11A and 11B are sectional views of a micro-resonator according to the second variant of the invention.
Figure 9:
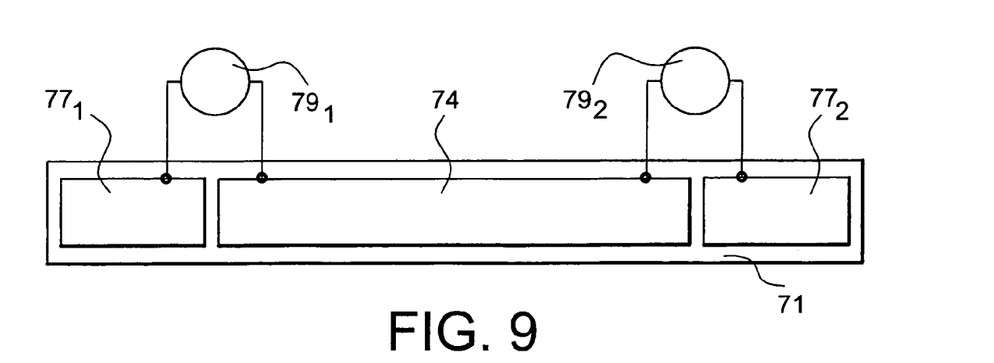
Figure 10:
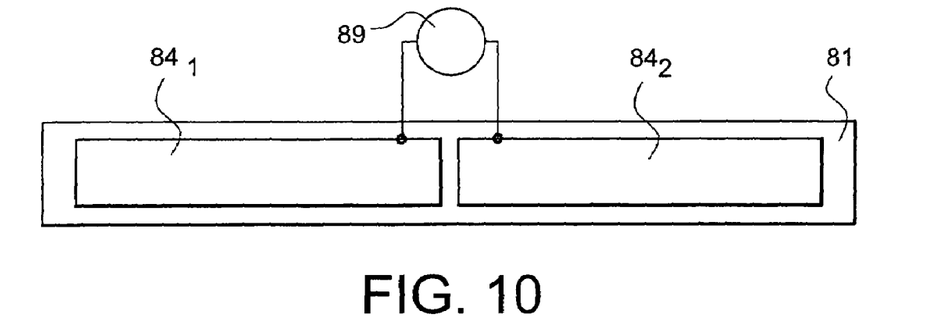

FIGS. 8 to 10 show top views illustrating several possible arrangements for the additional electrodes.

FIG. 8 reproduces the case of the top face of the beam made of a piezoelectric material 61 in which the excitation electrode 64 of the resonator and the additional electrode 67 are connected to the dc voltage generator 69 (see FIG. 7). The mechanical stress originates from the electric field induced by the DC voltage between the electrodes 64 and 67.

FIG. 9 shows a variant for which the beam made of a piezoelectric material 71 supports a resonator excitation electrode 74 on its top face and two additional electrodes $77_1$ and $77_2$ located on each side of the excitation electrode 74. Electrodes 74 and $77_1$ are connected to a first dc voltage generator $79_1$ to induce an electric field between these electrodes. Electrodes 74 and $77_2$ are connected to a second dc voltage generator $79_2$ to induce an electric field between these electrodes. The electric fields induced by these dc voltages induce mechanical stresses in the beam made of a piezoelectric material 71.

FIG. 10 shows a variant in which the beam made of a piezoelectric material 81 supports an excitation electrode for the resonator on its top face made of two parts $84_1$ and $84_2$. Each part $84_1$ and $84_2$ is connected to a dc voltage generator 89 that induces an electric field in the interval separating the parts $84_1$ and $84_2$.

Figure 11A:
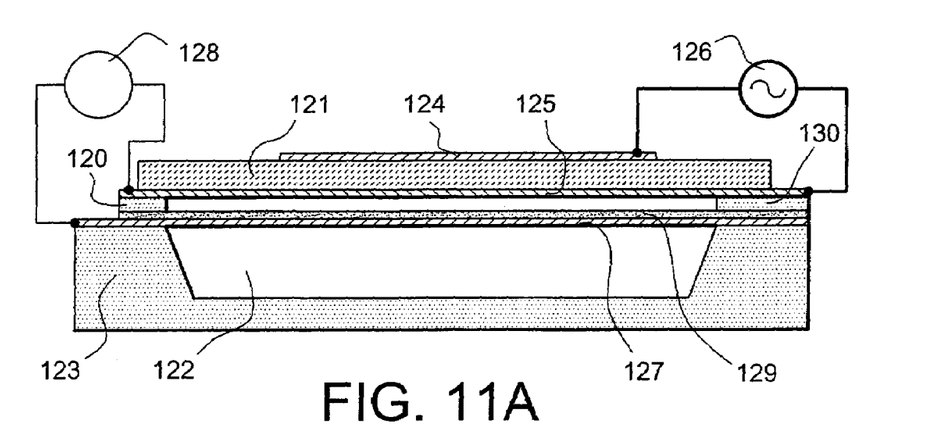
Figure 11B:
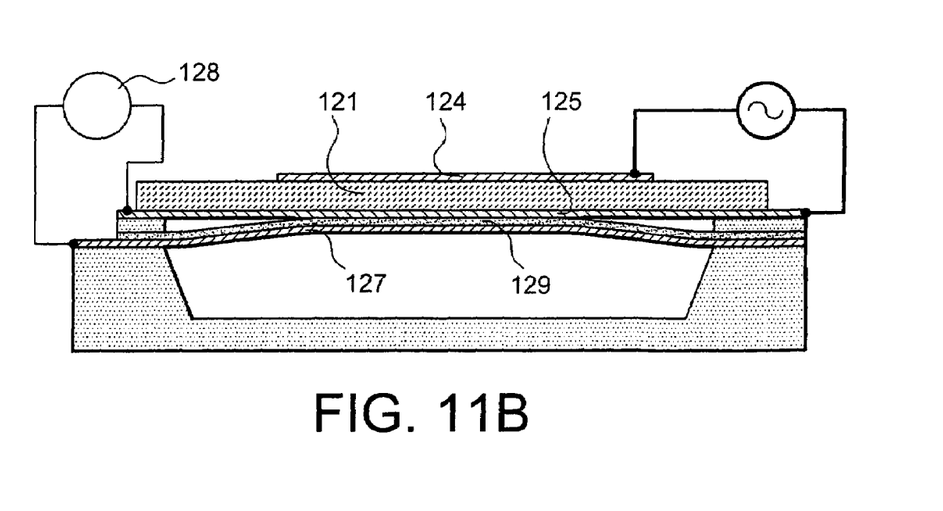

FIGS. 11A and 11B show sectional views of a micro-resonator according to the second variant of the invention. According to this variant, a variable load is applied to the resonator.

A beam made of a piezoelectric material 121 is suspended above a cavity 122 formed in a support 123. The cavity 122 may be 1 or 2 µm deep. The beam made of a piezoelectric material 121 is sandwiched between an upper electrode 124 and a lower electrode 125 that will excite the beam. To achieve this, the electrodes 124 and 125 are connected to an alternating voltage generator 126 at the resonant frequency of the chosen mode.

The assembly composed of the beam 121 and the electrodes 124 and 125 is fixed to the support 123 through elements 127, 129, 120 and 130. Element 127 is an electrode fixed to the support 123 and overhanging the cavity 122. It is coated by a layer of dielectric material 129. Elements 120 and 130 are spacers that maintain a spacing between the set of elements 125-121-124 and the set of elements 127-129 when the voltage generator 128 does not apply a DC voltage between electrodes 125 and 127, thus forming a loading beam. This is shown in FIG. 11A.

FIG. 11B shows the case in which the voltage generator 128 applies a polarisation voltage between electrodes 125 and 127 to force part of the loading beam onto the set of elements 125-121-124. The contact surface is variable in size depending on the polarisation voltage. The contact surface may vary the load applied on the resonator and therefore the resonant frequency of the resonator.

Figure 12A:
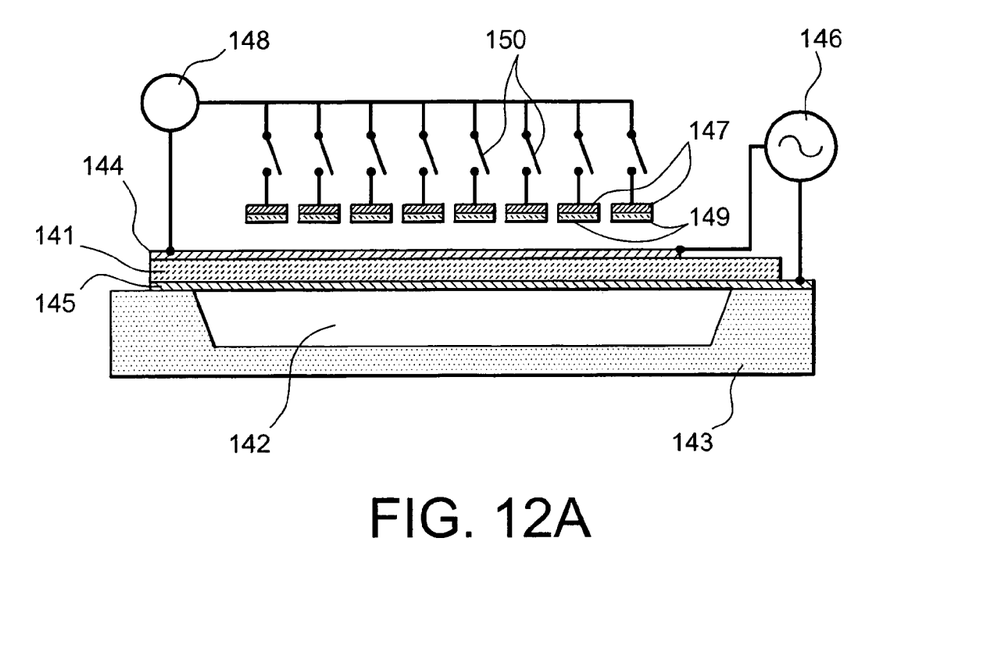
FIGS. 12A and 12B show a sectional view and a top view respectively of a micro-resonator according to the second variant of the invention.
Figure 12B:
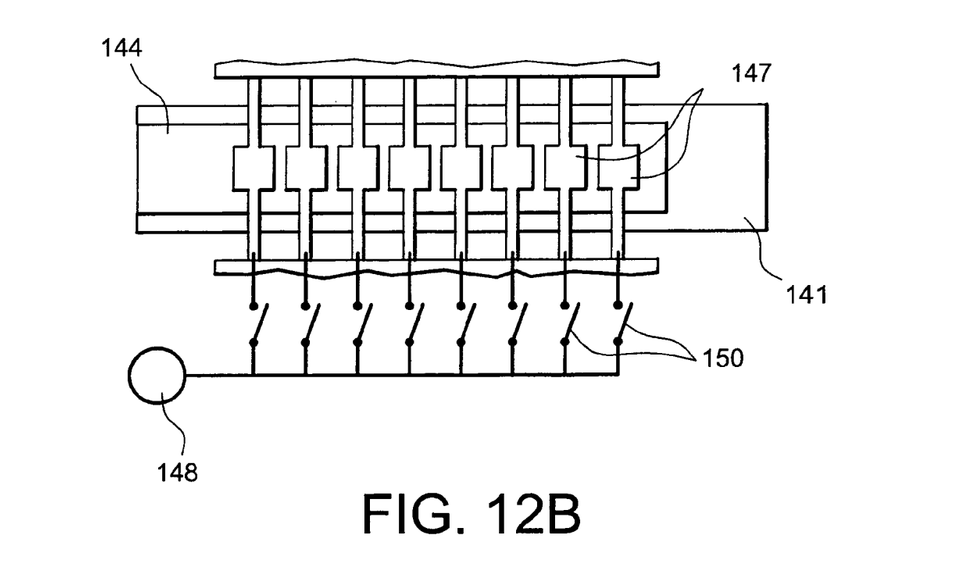

FIGS. 12A and 12B are sectional and top views respectively of another micro-resonator according to the second variant of the invention.

A beam made of a piezoelectric material 141 is suspended above a cavity 142 made in a support 143. The cavity 142 may be between 1 and 2 µm deep. The beam made of a piezoelectric material 141 is sandwiched between an upper electrode 144 and a lower electrode 145 that will excite the beam. To achieve this, the electrodes 144 and 145 are connected to an alternating voltage generator 146 at the resonant frequency of the chosen mode.

Unlike the micro-resonator shown in FIGS. 11A and 11B that only includes a single loading beam, the micro-resonator shown in FIGS. 12A and 12B includes several loading beams. These loading beams 149 are placed above or underneath the beam 141. They are activated by electrodes 147. In the case shown here, the loading beams are continuous or discontinuous dielectric layers supported by the support 143, located above the beam 141. The actuating electrodes 147 are metallic layers deposited on the loading beams 149. A dc voltage generator 148 is connected between the upper electrode 144 and the actuation electrodes 147, through switches 150.

Figure 13:
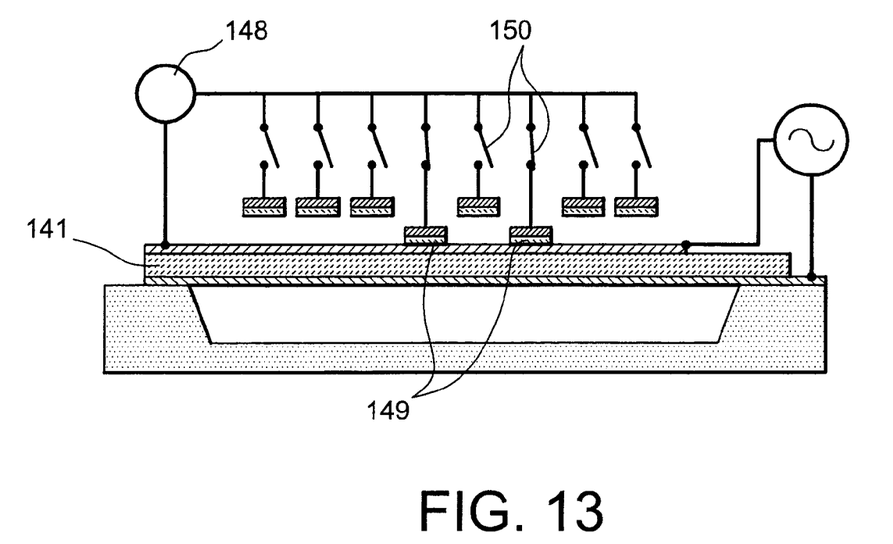
FIG. 13 is a view corresponding to FIG. 12A of the micro-resonator while it is being used.

FIG. 12A shows the micro-resonator when there is no mechanical stress applied to the beam 141. The variation in the resonant frequency is done discretely in steps as each of the loading beams comes into contact on the gate 141. Thus, FIG. 13 shows the case in which two loading beams 149 are applied to the beam 141 after their corresponding switch 150 has closed.

In the case described above, the counter electrode used to deflect the loading beams is the upper electrode of the beam made of a piezoelectric material. However, a counter electrode distinct from this upper electrode could be used. This is shown in FIG. 14 which is a top view of yet another micro-resonator according to a second variant embodiment.

Figure 14:
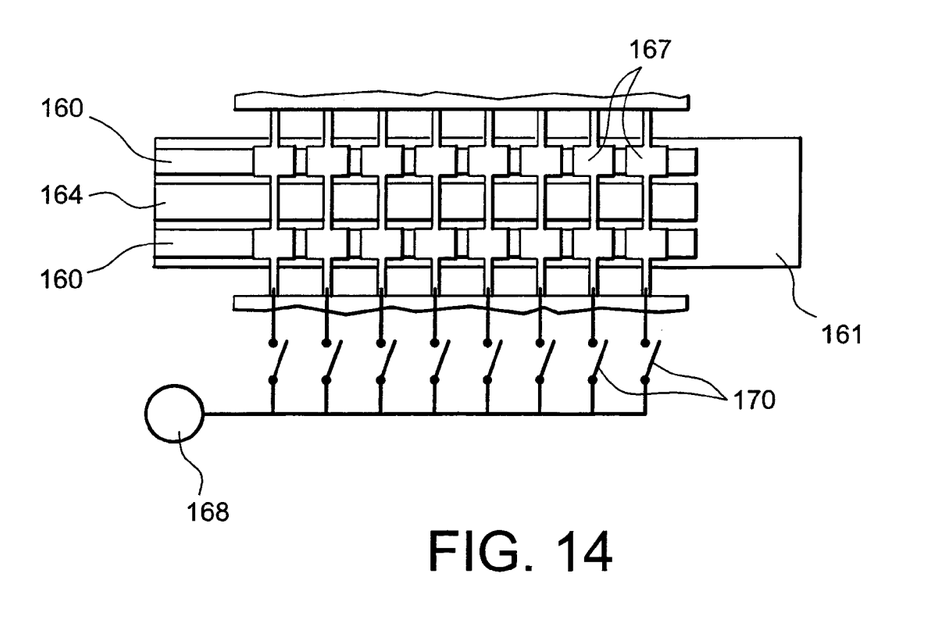
FIG. 14 is a top view of yet another micro-resonator according to the second variant embodiment.

FIG. 14 shows a beam made of a piezoelectric material 161 supporting an upper excitation electrode 164 along its longitudinal axis. The beam 161 also supports a counter electrode 160 formed from two conducting strips located on each side of the excitation electrode 164. The loading beams are arranged above the beam 161 and transverse to the beam 161, as described previously. They are covered by actuation electrodes 167 with widened parts facing the conducting strips of the counter electrode 160. A dc voltage generator 168 is connected between the counter electrode 160 and actuation electrodes 167, through switches 170.

Figure 15A:
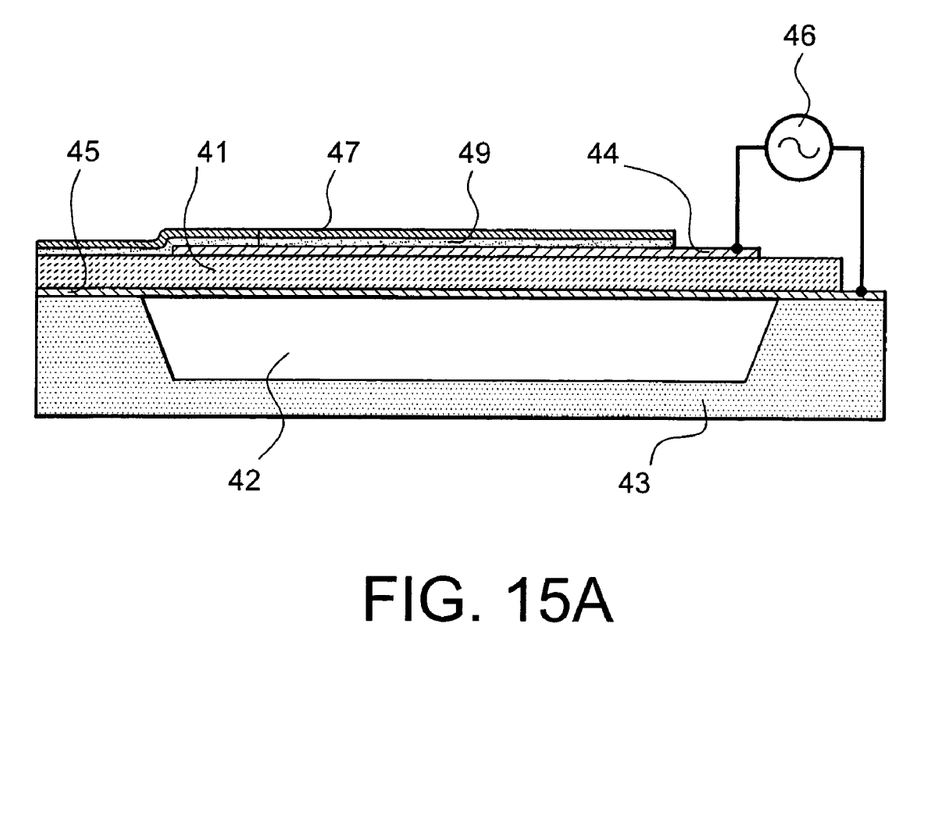
FIGS. 15A and 15B are sectional and top views respectively of a micro-resonator according to the third variant of the invention.
Figure 15B:
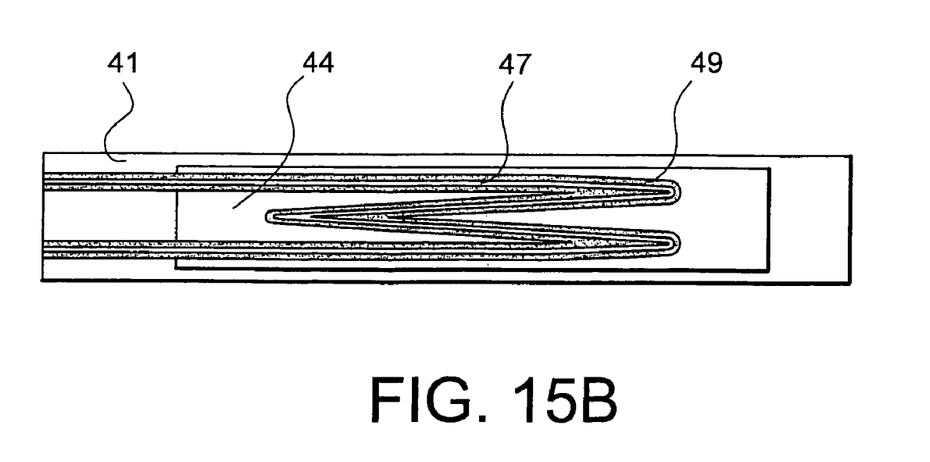

FIGS. 15A and 15B show sectional and top views respectively illustrating a micro-resonator according to the third variant of the invention. In this variant, the resonator temperature is modified.

A beam made of a piezoelectric material 41 is suspended above a cavity 42 made in a support 43. The cavity 42 may be 1 or 2 µm deep. The beam made of a piezoelectric material 41 is sandwiched between an upper electrode 44 and a lower electrode 45 that will be used to excite the beam. To achieve this, the electrodes 44 and 45 are connected to an alternating voltage generator 46 at the resonant frequency of the chosen mode.

The excitation electrode 44 supports a sequence consisting of a layer of dielectric material 49 acting as an electrical insulation and a filiform heating resistance 47. The temperature increase induced by passing an electrical current in the resistance 47 modifies the characteristics of the resonator, which results in a variation of the resonant frequency.

In the different variants of the micro-resonator according to the invention described above, the beam is separated from the support by the presence of a cavity. Another approach would be to etch the entire back face of the support to release the beam.

The layer 9 forming the support beam visible in FIG. 1 may also be present in the other variants of micro-resonators according to the invention.

We will now describe the manufacture of a micro-resonator according to the invention. This embodiment is illustrated in FIGS. 16A to 16H.

Figure 16A:
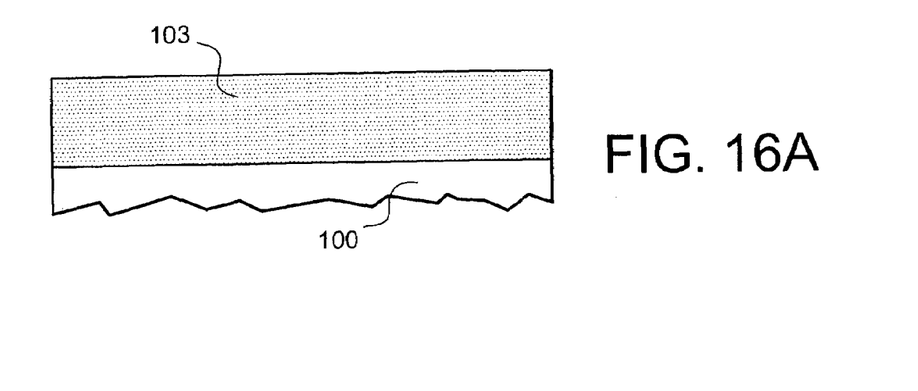
FIGS. 16A to 16H are sectional views illustrating a process for making a micro-resonator using the first variant of the invention.

FIG. 16A shows a support consisting of a silicon substrate 100 on a face on which a 2 µm thick layer 103 of silicon oxide has been deposited.

Figure 16B:
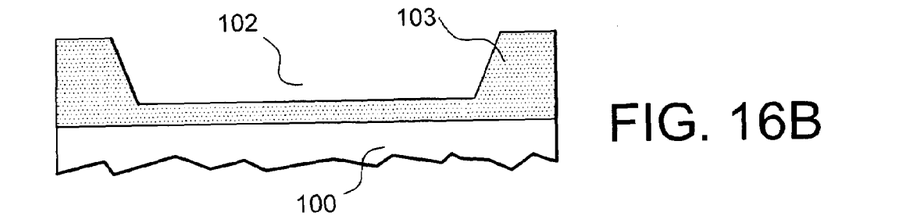

A 1.5 µm deep cavity 102 is formed in the silicon oxide layer 103. This is shown in FIG. 16B.

Figure 16C:
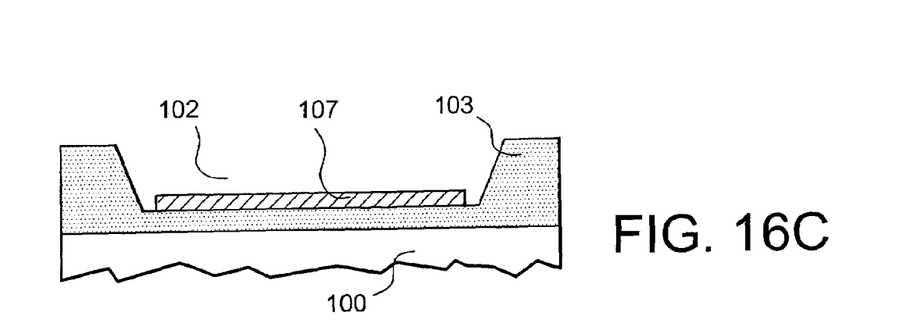

An 0.8 µm thick metallic deposit is made at the bottom of the cavity 102 to supply the electrode 107 that will deform and constrain the resonator, as shown in FIG. 16C.

Figure 16D:
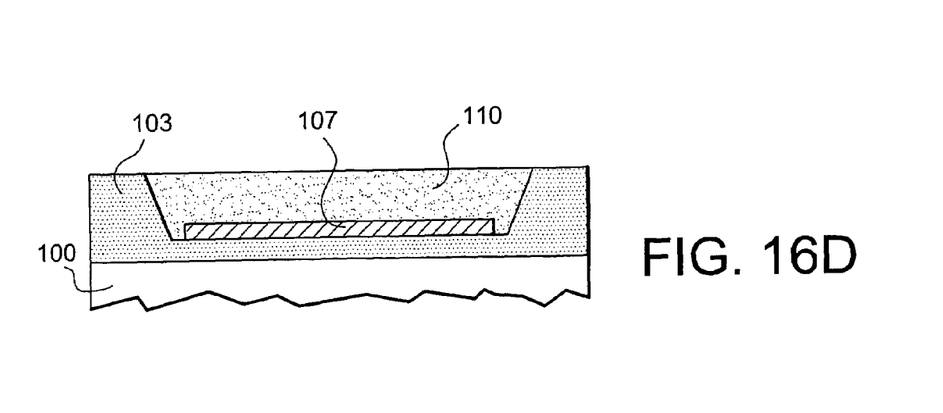

A sacrificial layer 110 is then deposited in the remaining part of the cavity to fill it and to reach the top level of the layer 103. This is shown in FIG. 16D.

Figure 16E:
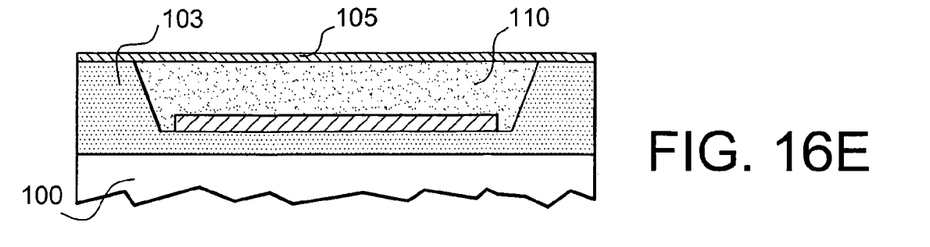

A 0.2 µm thick metallic deposit is made in order to make the lower excitation electrode 105 of the resonator. This is shown in FIG. 16E.

Figure 16F:
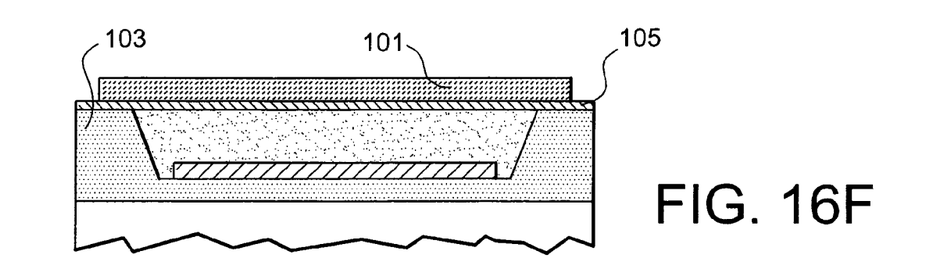

The resonator beam made of a piezoelectric material 101 is then deposited on the lower electrode 105. This is shown in FIG. 16F.

Figure 16G:
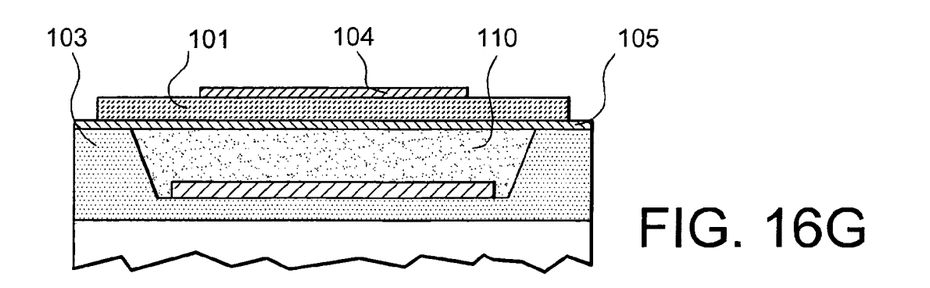

A 0.2 µm thick metallic deposit is then made on the beam made of a piezoelectric material 101 to obtain the upper excitation electrode 104 of the resonator. This is shown in FIG. 16G.

Figure 16H:
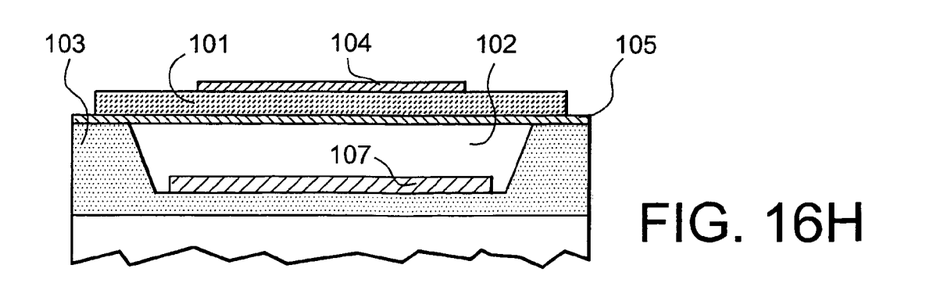

The next step is then to remove the sacrificial layer 110 to release the resonator and obtain the structure shown in FIG. 16H.

Therefore, this invention can be used to make integrated and tuneable RF resonators and filters using a manufacturing process compatible with manufacturing of integrated circuits. It can be used to make more "robust" filters since the resonant frequency of each oscillator can be adjusted after it has been manufactured, by controlling the mechanical stress and no longer by a very precise control over the thickness of the beam made of a piezoelectric material. It makes it possible to make a tuneable filter.

The invention claimed is:

1. A suspended film bulk acoustic micro-resonator, comprising:
 a beam made of a piezoelectric material fixed to a support, and with a thickness selected to operate at a given resonant frequency, the beam being sandwiched in a direction of a thickness of the beam between excitation electrodes, wherein the beam does not electrically contact the support; and
 means for modifying limiting conditions of the resonator including the sandwiched beam to modify the resonant frequency.

2. The micro-resonator according to claim 1, wherein the means for modifying the limiting conditions of the resonator comprises means for applying a mechanical stress on the beam.

3. The micro-resonator according to claim 2, wherein the means for applying a mechanical stress on the beam enables application of an electrostatic force on the beam, resulting in bending of the beam.

4. The micro-resonator according to claim 3, wherein the beam is fixed to the support by two ends of the beam.

5. The micro-resonator according to claim 3, wherein the beam is fixed to the support by only one end of the beam.

6. The micro-resonator according to claim 3, wherein the beam is separated from the support by a cavity facing the beam, and the means for applying a mechanical stress includes at least one first electrode located on the beam and at least one second electrode facing the at least one first electrode and the cavity.

7. The micro-resonator according to claim 6, wherein the at least first electrode used to apply the electrostatic force located on the beam is one of the excitation electrodes.

8. The micro-resonator according to claim 2, wherein the means for applying a mechanical stress on the beam comprises means for producing a bimetallic strip effect.

9. The micro-resonator according to claim 8, wherein the means for producing a bimetallic strip effect includes at least one bimetallic strip effect device resulting from a metallic layer formed on one face of the beam and a heating element.

10. The micro-resonator according to claim 9, wherein the means for producing a bimetallic strip effect is located on one face of the beam.

11. The micro-resonator according to claim 9, wherein the means for producing a bimetallic strip effect forms at least one double bimetallic strip, a first bimetallic strip effect device being located on a first face of the beam and a second bimetallic strip effect device being located on a second face of the beam, the two bimetallic strip effect devices being located facing each other.

12. The micro-resonator according to claim 9, wherein the heating element comprises an electrical resistance supported by the metallic layer and separated from the metallic layer by a layer of electrical insulation.

13. The micro-resonator according to claim 9, wherein the heating element comprises the metallic layer of the bimetallic strip effect device.

14. The micro-resonator according to claim 2, wherein the means for applying a mechanical stress on the beam comprises piezoelectric means.

15. The micro-resonator according to claim 14, wherein the piezoelectric means includes electrodes on at least one face of the beam, for applying an electric field to the beam, which results in a compression/expansion stress or a shear stress in a plane of the beam.

16. The micro-resonator according to claim 15, wherein one of the electrodes of the piezoelectric means is an excitation electrode.

17. The micro-resonator according to claim 1, wherein the means for modifying the limiting conditions of the resonator comprises means for applying a mechanical load on the beam.

18. The micro-resonator according to claim 17, wherein the means for applying a mechanical load on the beam comprises at least one loading beam fixed to the support and facing the beam made of the piezoelectric material so as to apply the mechanical load under action of an electrostatic force applied to the loading beam by means for applying an electrostatic force.

19. The micro-resonator according to claim 18, wherein the means for applying an electrostatic force comprises a first electrode arranged on the loading beam and a second electrode of one of the excitation electrodes.

20. The micro-resonator according to claim 1, wherein the means for modifying the limiting conditions of the resonator comprises means for modifying a temperature of the beam made of the piezoelectric material.

21. The micro-resonator according to claim 20, wherein the means for modifying the temperature of the beam made of the piezoelectric material comprises at least one electrical resistance.

22. The micro-resonator according to claim 21, wherein the at least one electrical resistance is arranged on one of the excitation electrodes and is separated from the one of the excitation electrodes by a layer of electrical insulation.

23. The micro-resonator according to claim 1, wherein the beam made of the piezoelectric material provided with the excitation electrodes is fixed to the support through a layer of a dielectric material.

* * * * *